US010765025B2

(12) United States Patent
Clements et al.

(10) Patent No.: US 10,765,025 B2
(45) Date of Patent: Sep. 1, 2020

(54) STABILIZING ARRANGEMENT FOR TRANSPORTING A SWITCH CABINET (71) Applicant: Rittal GmbH & Co. KG, Herborn (DE)

(72) Inventors: Paul Clements, Plymouth (GB); Malcom Sillingford, Plymouth (GB)

(73) Assignee: Rittal GmbH & Co. KG (DE)

( * ) Notice: Subject to any disclaimer, the term of this patent is extended or adjusted under 35 U.S.C. 154(b) by 0 days.

(21) Appl. No.: 16/129,987

(22) Filed: Sep. 13, 2018

(65) Prior Publication Data
US 2019/0132976 A1     May 2, 2019

(30) Foreign Application Priority Data

Oct. 26, 2017    (EP) .................................... 17198430

(51) Int. Cl.
*H05K 5/02*        (2006.01)
*H02B 1/38*        (2006.01)
*H02B 1/30*        (2006.01)
*H02B 3/00*        (2006.01)
(Continued)

(52) U.S. Cl.
CPC ......... *H05K 5/0234* (2013.01); *B65D 19/385* (2013.01); *H02B 1/30* (2013.01); *H02B 1/306* (2013.01); *H02B 1/38* (2013.01); *H02B 3/00* (2013.01); *H05K 5/0226* (2013.01);
(Continued)

(58) Field of Classification Search
CPC .... H05K 5/0226; H05K 5/0234; H05K 7/186; B65D 19/385; H02B 1/30; H02B 1/38; H02B 1/306; H02B 3/00

USPC ......... 312/257.1, 265.1, 265.2, 265.3, 265.4, 312/265.5, 326, 329
See application file for complete search history.

(56) References Cited

U.S. PATENT DOCUMENTS

| 5,542,720 A | * | 8/1996 | Fleming | ................. E05B 63/20 292/32 |
| 8,733,853 B2 | * | 5/2014 | Gingrich | .............. H02B 13/025 312/216 |
| 9,297,181 B2 | * | 3/2016 | Gasparetto | .............. E05B 65/06 |

(Continued)

FOREIGN PATENT DOCUMENTS

| CN | 204425828 U | 6/2015 |
| DE | 19615430 C1 | 8/1997 |

(Continued)

*Primary Examiner* — James O Hansen
(74) *Attorney, Agent, or Firm* — Harness, Dickey & Pierce, P.L.C.

(57) ABSTRACT

The invention relates to a stabilizing arrangement for transporting a switch cabinet, with a switch cabinet which comprises a frame stand consisting of vertical and horizontal struts, and with a switch cabinet door fastened on a door side of the frame stand by at least one hinge, so that the switch cabinet door can be pivoted back and forth between an open position in which it is pivoted away from the door side and a closed position in which it rests on the door side, characterized in that at least one positive-locking part is fastened on the door side and which extends away from the door side with its free end and comprises an undercut on its free end, wherein the switch cabinet door comprises a positive receptacle into which receptacle the positive-locking part extends with its free end in the closed position and extends behind the undercut in the closed position.

12 Claims, 10 Drawing Sheets (51) Int. Cl.
 *B65D 19/38* (2006.01)
 *H05K 7/18* (2006.01)
(52) U.S. Cl.
 CPC ..... *H05K 7/186* (2013.01); *B65D 2519/0098* (2013.01); *H02B 1/301* (2013.01); *H02B 1/303* (2013.01)

(56) References Cited

U.S. PATENT DOCUMENTS

2011/0260591 A1 10/2011 Peng et al.
2014/0097734 A1 4/2014 Gingrich

FOREIGN PATENT DOCUMENTS

DE 19939614 C1 9/2001
DE 10202845 C1 8/2003

* cited by examiner

STABILIZING ARRANGEMENT FOR TRANSPORTING A SWITCH CABINET

CROSS REFERENCE TO RELATED APPLICATION

This application claims the benefit and priority of European Patent Application No. 17198430.5 filed Oct. 26, 2017. The entire disclosure of the above application is incorporated herein by reference.

FIELD

The invention relates to a stabilizing arrangement for transporting a switch cabinet, with a switch cabinet which comprises a frame stand consisting of vertical and horizontal struts, and with a switch cabinet door fastened on a door side of the frame stand by at least one hinge, so that the switch cabinet door can be pivoted back and forth between an open position in which it is pivoted away from the door side and a closed position in which it rests on the door side. A stabilizing arrangement is known from CN 204425828 U in which the switch cabinet frame stand is additionally reinforced by a stiffening structure. Similar arrangements are also shown in DE 102 02 845 C1 and DE 196 15 430 C1.

BACKGROUND

The stabilizing arrangements known from the prior art have the disadvantage that their construction is designed to be expensive and they require in part a significant expense for material. Therefore, for example, it is provided in CN 204425828 U that the rear wall of the switch cabinet is designed with a double wall in order to impart stability to the switch cabinet.

The invention therefore has the task of further developing a stabilizing arrangement of the initially described type in such a manner that it can be made available with simple and therefore economical technical means. Furthermore, the stabilizing arrangement should be designed in such a manner that that the means provided for the stabilization can be readily removed after the transport, that is, after the switch cabinet housing has reached its final position.

Accordingly, it is provided that at least one positive-locking part is fastened on the door side and which extends away from the door side with its free end and comprises an undercut on its free end, wherein the switch cabinet door comprises a positive receptacle, preferably on its inside facing the door side in the closed position into which receptacle the positive-locking part extends with its free end in the closed position and extends behind the undercut in the closed position.

Therefore, in the described stabilizing arrangement the switch cabinet door is stabilized relative to the frame stand during the transporting of the switch cabinet by the positive-locking part of the frame stand which engages into the positive receptacle of the switch cabinet door, so that the switch cabinet door has the additional function during transport of stabilizing the frame stand in itself. The stabilizing can be improved in that several pairs consisting of a positive receptacle and the positive-locking part which engages in it are provided, for example, in a diametrically opposing manner. As concerns its functionality, the switch cabinet door has the effect of a stiffening strut extending transversely in the door side when given diametrically opposing pairs consisting of a positive receptacle and the positive-locking part engaging in it.

The positive-locking parts can be designed as one-part or multi-partite plastic formed parts or metallic formed parts which can be connected to the frame stand of the switch cabinet via the door side of the frame stand as needed by screws or can be connected in another, detachable manner. In addition, it can be provided, for example, that the positive-locking parts are fixed via the system perforations consisting of fastening receptacles spaced at regular intervals, which perforations are present in any case in customary frame stands. To this end, for example, an insertion nut with an inner thread can be arranged in one of the fastening receptacles whereas the positive-locking part comprises a threaded bolt with which it is screwed into the insertion nut and is therefore fixed to the frame stand.

The free end of the positive-locking part can have a maximum dimension in the direction of the extension direction of the positive-locking part, which dimension corresponds to an inner dimension of the positive receptacle. Furthermore, the free end can have a running contour along which the positive-locking part widens out from its front side to the maximum dimension. Therefore, when the switch cabinet door is pivoted closed, a secure introduction of the free end is also ensured then into the positive receptacle of the switch cabinet door if, for example, due to manufacturing tolerances when the positive receptacle and the positive-locking part meet one another, the two do not align exactly.

The free end can merge in the direction of the extension of the positive-locking part on the undercut into a shaft of the positive-locking part via which the positive-locking part is fixed on the door side. The shaft can have a maximum dimension in the direction vertical to the direction of the extension of the positive-locking part which dimension is smaller than an inner dimension of the positive receptacle. In particular, it is not necessary that the shaft is positively received in the positive receptacle. The function of the stabilizing arrangement can be met already in that, for example, twistings of the switch cabinet frame stand which occurred during the transporting of the switch cabinet are limited to a certain (low) maximally admissible mass.

The positive receptacle can be a perforation in an U-shaped doubling back on the outer circumference of the switching cabinet door. The U-shaped doubling back can be in particular a doubling back on the outer circumference of the door leaf of the switch cabinet door. The door leaf can be doubled back in a U shape toward the inside of the door. Therefore, in the closed position the free end and be received between the two flanges of the U-shaped doubling back which are spaced parallel to one another.

The positive-locking part can comprise a body and fastening means which immovably fixes the body on the door side. The body comprises the free end and a shaft adjacent to it via the undercut via which shaft the positive-locking part borders on the door side, in particular rests on the frame stand.

The body and the fastening means can be constructed as separate structural components. The body can comprise a through bore via which the body is fastened to the door side with the fastening means, in particular with a screw bolt.

The through bore can extend through the body eccentrically and parallel to an axis of symmetry of the body, wherein the shaft comprises a projection on its end facing the door side, which projection is also arranged eccentrically to the axis of symmetry of the body but opposite the through bore relative to the axis of symmetry, and wherein the shaft rests with the projection on a horizontal support of the frame stand.

The body and the fastening means can also be formed in one part, wherein the fastening means, in particular a screw bolt, extends concentrically to the shaft and is formed on a shaft end facing the door side.

The door side can have a rectangular profile frame, wherein two of the positive-locking parts are arranged in a diametrically opposite manner on the profile frame.

Two pairs of positive-locking parts can be arranged on the profile frame, of which the two positive-locking parts of a first one of the pairs and the two positive-locking parts of a second one of the pairs are arranged diametrically opposed, in particular in diametrically opposed corner areas of the profile frame.

The frame stand can have a rectangular bottom frame consisting of four horizontal struts of which one horizontal strut lies in the door side and the at least one holding angle is mounted on this horizontal strut via a fastening flange of the holding angle which is located in the door side, wherein the at least one positive-locking part is fixed on the fastening flange and the fastening flange is preferably fixed on the horizontal strut via a threaded bolt of the positive-locking part.

The switch cabinet can be fastened by the at least one holding angle to at least one sliding board underneath the bottom frame, wherein the bottom frame stands up on a transport pallet under which a forklift can move via the at least one holding angle at a distance from the at least one sliding board.

The bottom frame can comprise a holding angle designed as an L angle, on each of its four corners by which the switch cabinet is fastened to a sliding board, wherein the distance at which the bottom frame is fastened to the at least one sliding board corresponds to a vertical dimension of the switch cabinet base, and wherein the holding angle is fastened to a vertical side of the bottom frame and extends away from the switch cabinet with its standing-up flange, so that a standing-up side of the bottom frame is completely free for the mounting of a switch cabinet on the standing-up side. Corresponding holding angles can be fastened on another horizontal strut of the bottom frame which strut is arranged opposite the horizontal strut in the door side, in particular in a back wall side of the frame stand.

The transport pallet can comprise a border which surrounds at least one sliding board so that the switch cabinet cannot be moved on the transport pallet in the horizontal direction or, in the case of a tilted pallet, in the plane of a standing-up surface of the pallet.

DRAWINGS

Other details of the invention will be explained using the following figures. In the figures.

DETAILED DESCRIPTION

Figure 1:
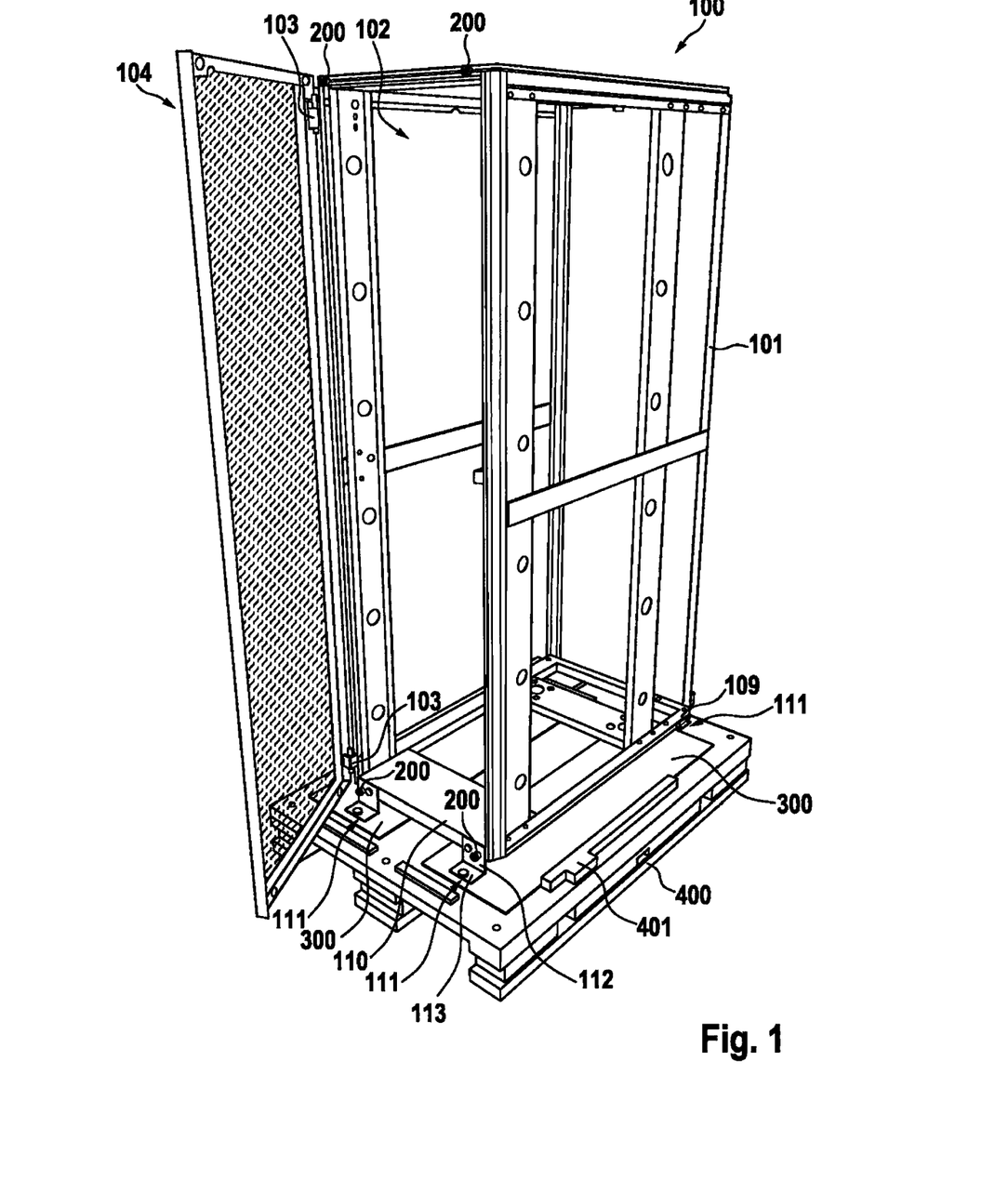
FIG. 1 shows a perspective view of an exemplary embodiment of a stabilizing arrangement.

FIG. 1 shows an exemplary embodiment of a stabilizing arrangement for the transport of a switch cabinet 100. The switch cabinet 100 comprises a frame stand 101 consisting of vertical and horizontal struts, wherein a switch cabinet door 104 is fastened on a door side 102 of the frame stand 101 by three hinges 103. The switch cabinet door 104 can therefore be pivoted back-and-forth between an open position in which it is pivoted away from the door side 102 (as shown) and a closed position in which it rests on the door side 102 (compare FIGS. 6 and 7).

Four positive-locking parts 200 are fastened on the door side 102 and extend with their free ends 201 away from the door side 102. The positive-locking parts 200 are fastened to this end in particular on a vertical profile side of the horizontal struts of the door side 102, for example, screwed to the profile side by a system of perforations consisting of regularly spaced fastening receptacles. In particular, a positive-locking part 200 is arranged in front in one of the four corners of the door side 102 and/or along the horizontal profiles of the door side 102 of its particular corner.

Furthermore, the frame stand 101 comprises a rectangular bottom frame 109 consisting of four horizontal struts. One of the horizontal struts, namely, the horizontal strut characterized by the reference numeral 110, is arranged in the door side 102. Another horizontal strut of the bottom frame 109 and located opposite the horizontal strut 110 arranged in the door side 102 is arranged in the back wall side of the frame stand 101. Two holding angles 111 are fastened via the horizontal struts 110 in the door side 102 and in the back wall side by a fastening flange 112 located in the door side 102. One of the positive-locking parts 200 is fastened on each of the two holding angles 111, in particular on the particular fastening flange 112. The switch cabinet 100 is fastened via the holding angle 111 on two sliding boards 300 underneath the bottom frame 109. In particular, the bottom frame 109 is set via the four holding angles 111 at a distance to the sliding boards 300 on a transport pallet 400 under which a fork lift can move.

In particular, the bottom frame comprises holding angles 111 formed as L-angles at each of its four corners and by which the switch cabinet is fastened on one of four sliding boards. The distance at which the bottom frame 109 is fastened from the sliding boards 300 corresponds to a vertical dimension of a switch cabinet base. The holding angles 111 are fastened on the vertical side of the bottom frame 109 and extend away with their stand-up flange 113 from the switch cabinet 100 so that a stand-up side of the bottom frame 109 is completely exposed for the mounting of the switch cabinet based on the stand-up side.

Figure 2:
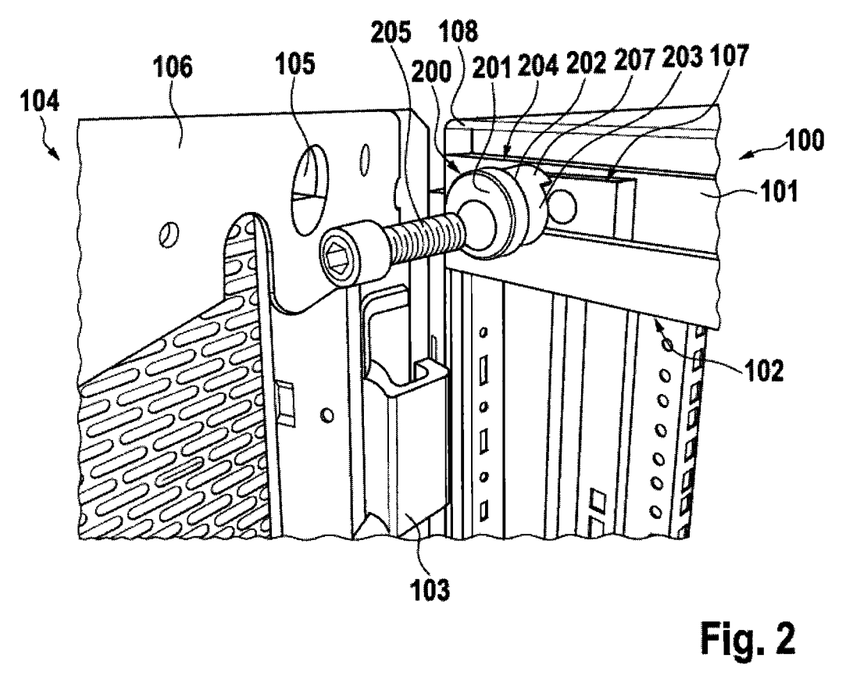
FIG. 2 shows a perspective view of the corner area of a switch cabinet of a stabilizing arrangement according to an embodiment in an exploded view of the positive-locking part.

The transport pallet 400 comprises a border of 401 which surrounds the sliding boards 300 and therefore immovably holds the switch cabinet 100 on the transport pallet 400 in the horizontal position or in the plane of the standing surface of the transport pallet 400 when the pallet is tilted. As is shown in FIG. 2, this makes it possible in particular for transporting the switch cabinet with a forklift 500 that the switch cabinet with its customary built-in components (mounting plate, etc.) can be tilted up to an edge height of approximately 20 cm without being moved on the transport pallet 400 as a result. Due to the positive-locking parts 200 which engage into the positive receptacles 105, a twisting of the frame stand 101 during the tilting of the switch cabinet 100 can be counteracted in the closed position of the switch cabinet door 104.

Figure 3:
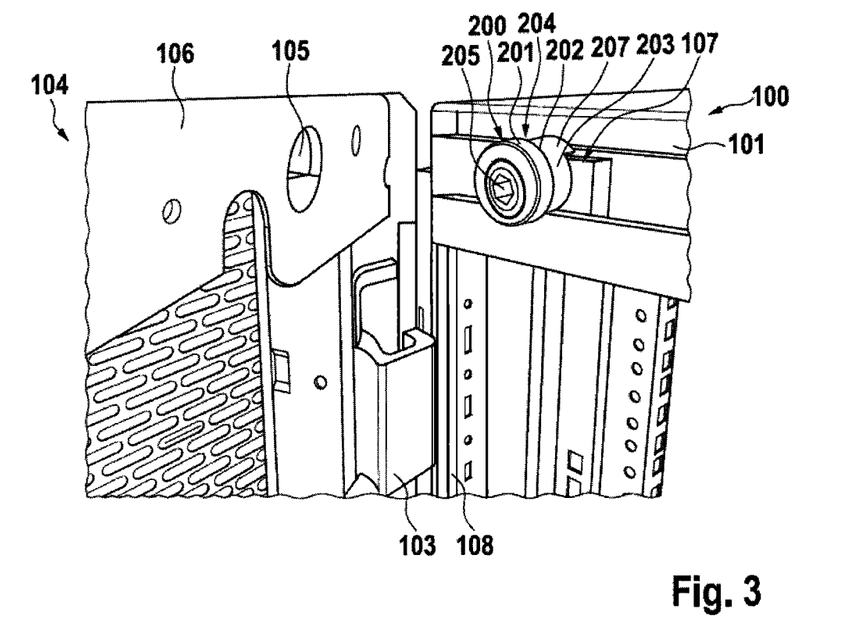
FIG. 3 shows the embodiment and view according to FIG. 2, wherein the positive-locking part is shown in the completely mounted position.

FIGS. 2 and 3 show a first positive-locking part 200 in an installed situation on the roof frame of a switch cabinet 100. The profile struts of the roof frame comprise a support 107 facing the switch cabinet door 104 in the closed position of the switch cabinet door 104 on which support the positive-locking part 200 rests with a projection 207 and is therefore aligned in the vertical direction opposite the frame stand 101.

The switch cabinet door 104 comprises on its outer circumference a U-shaped doubling back 106 which is doubled back from the door leaf of the switch cabinet door 104 toward the inside of the switch cabinet door 104. A positive receptacle 105 in the shape of a circular opening is formed in a flange of the U-shaped doubling back 106 arranged parallel to and at a distance from the door leaf, into which opening the positive-locking part 200 engages with its free end 201 in the closed position of the switch cabinet door 104. The free end 201 merges over an undercut 202 into a shaft-shaped section 203 of the positive-locking part 200. The projection 207 extends beyond a contact surface of the shaft 203, by which the shaft 203 rests on a vertical profile side of the frame stand 101, especially of the roof frame.

The positive-locking part 200 is constructed in a bipartite manner and comprises in addition to a body 204 comprising the free end 201, the undercut 202 and the shaft 203 a fastening means 205 in the form of a screw bolt with which the body 204 can be screwed to the frame stand 101. In addition, the frame stand 101 comprises in particular an arrangement consisting of regularly spaced fastening receptacles. For example, a cage nut can be used for the screwing into one of the fastening receptacles.

Figure 4:
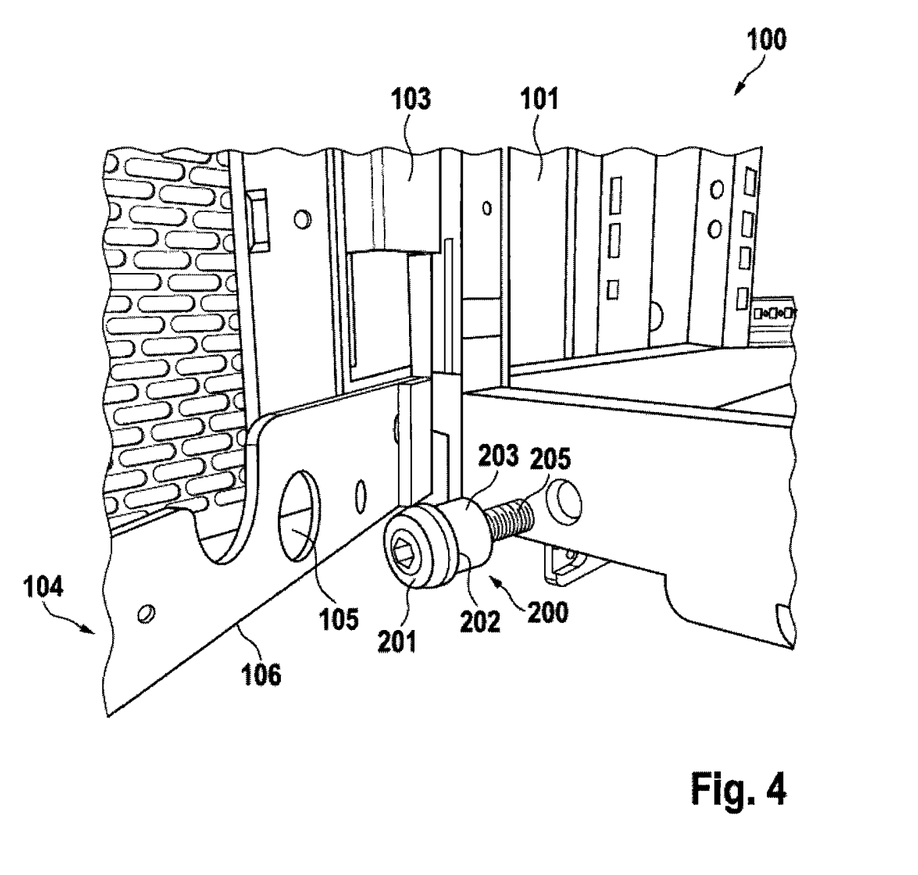
FIG. 4 shows a perspective view of the corner area of another embodiment of the invention, wherein the positive-locking part is shown in a position dismounted from the switch cabinet.
Figure 5:
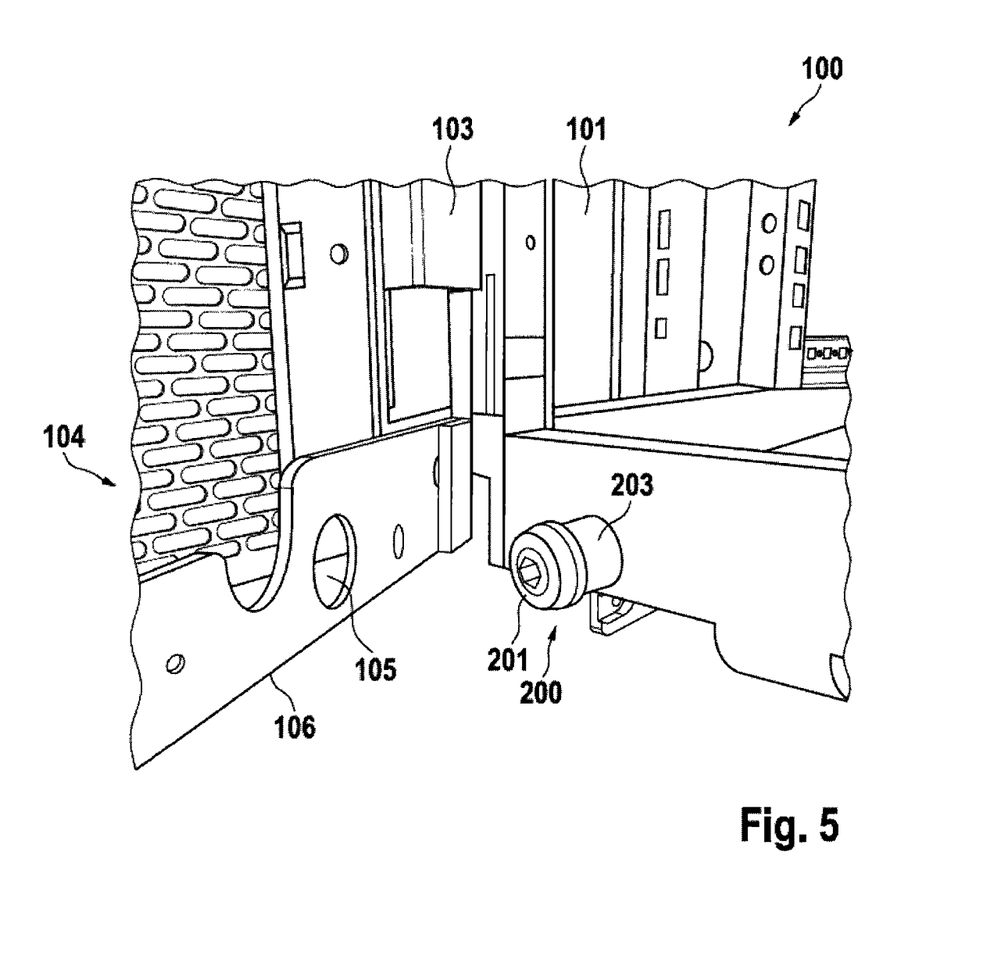
FIG. 5 shows the embodiment and view according to FIG. 4, wherein the positive-locking part is mounted on the switch cabinet frame.

FIGS. 4 and 5 show another embodiment of a positive-locking part 200 which is screwed in the area of a bottom frame of the frame stand 101 in the corner area of the bottom frame. In analogy with the positive-locking part 200 shown in the FIGS. 3 and 4, the positive-locking part 200 according to the FIGS. 4 and 5 also comprises a free end 201 with a running contour which merges via an undercut 202 into a shaft 203. The fastening means is formed in one part on the shaft 203 on the end of the shaft 203 opposite the free end 201 concentrically to the shaft 203 and can be constructed in particular in the manner of a threaded bolt.

The positive receptacle 105 is again constructed analogously to the positive receptacles shown in FIGS. 3 and 4 as a circular opening in a U-shaped doubling back 106 on the outer circumference of a switch cabinet door 104. The free end 201 comprises a tool receptacle, for example, an inner hexagon, concentric to the threaded bolt 205. The inner hexagon can be constructed to be identical to the inner hexagon of the fastening means 205 of the bipartite embodiment shown in the FIGS. 2 and 3.

Figure 6:
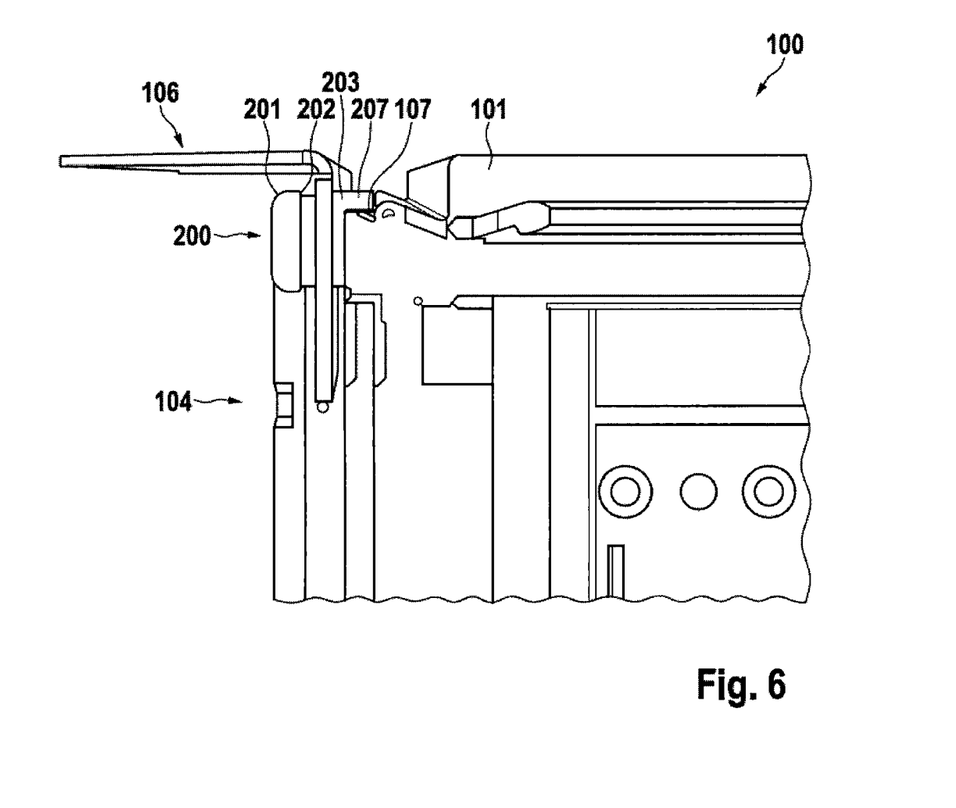
FIG. 6 shows a side view of the corner area of an embodiment of a stabilizing arrangement according to the invention in the roof area of the switch cabinet.
Figure 7:
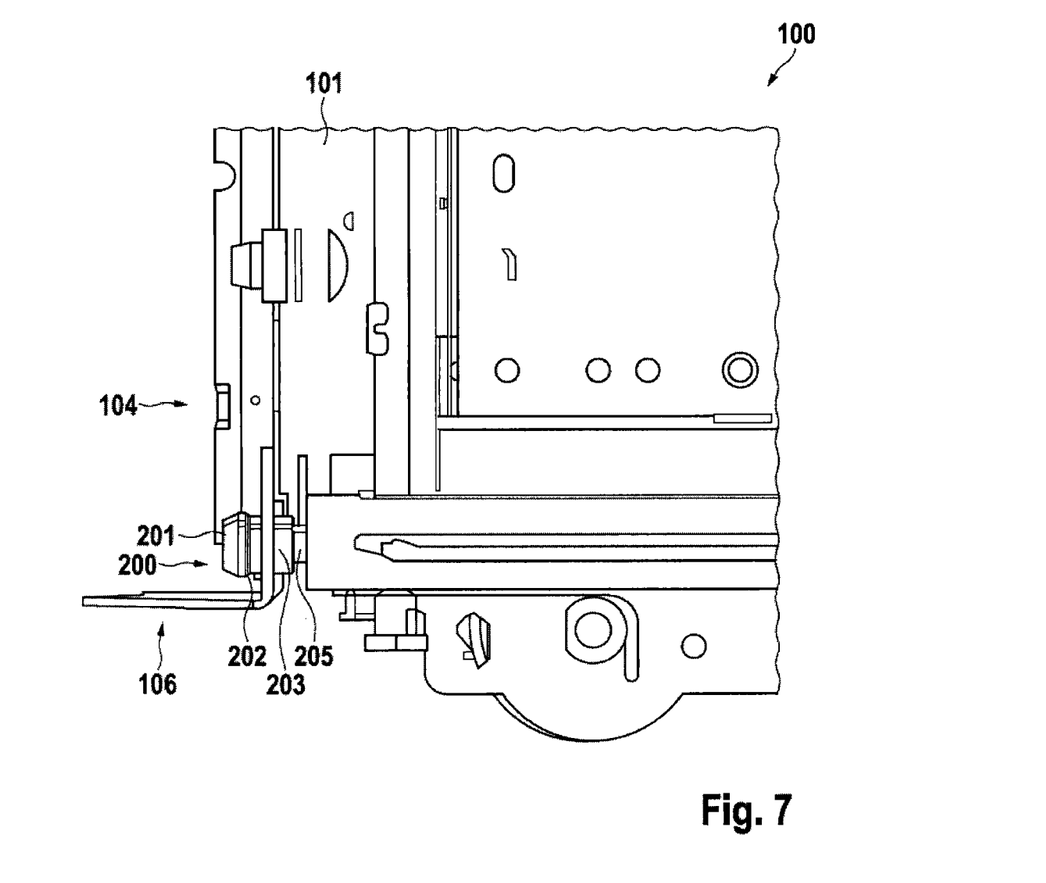
FIG. 7 shows the embodiment according to FIG. 6, wherein the corner area of the bottom frame of the switch cabinet is shown.
Figure 12:
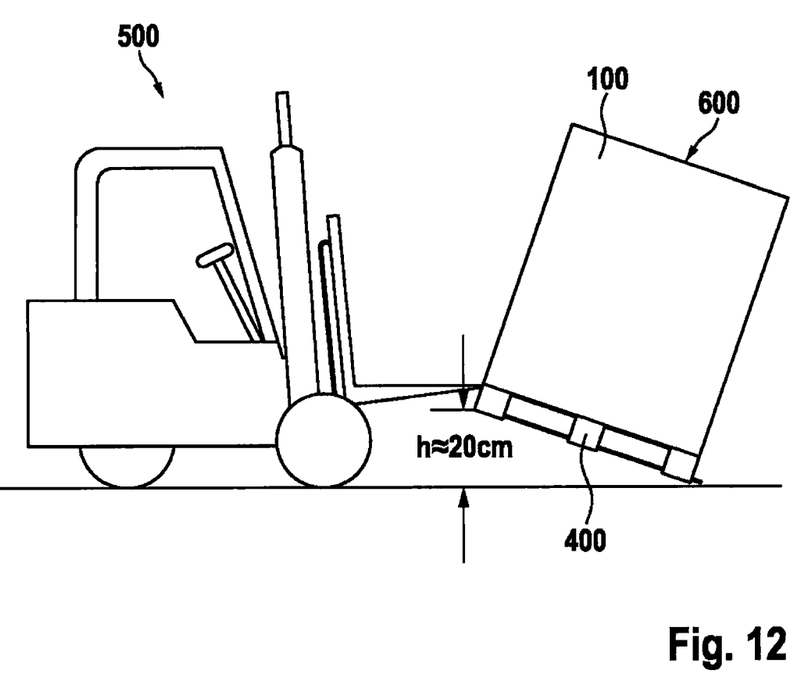
FIG. 12 shows an exemplary transport situation using a stabilizing arrangement according to the invention.

The FIGS. 6 and 7 each show a switch cabinet 100 in which switch cabinet door 104 is arranged in the closed position. While the FIG. 6 shows the switch cabinet 100 in the area of the roof frame, FIG. 7 shows the switch cabinet in are area of the bottom frame. In the closed position shown, the positive-locking part 200 extends with its free end 201 through a vertical flange of the U-shaped doubling back 106 at least so far that undercut 202 of the positive-locking part extends behind the vertical flange of the U-shaped doubling back. In the area of the shaft 203 with which the positive-locking part 200 extends through the flange of the U-shaped doubling back 106, the outside diameter of the positive-locking part 200 can be less than the inside diameter of the positive receptacle 105 (see FIGS. 2 to 5), so that the stabilizing arrangement allows a certain maximum twisting of the frame stand 101 when the frame stand 101 is loaded, for example, during a tilting of the switch cabinet, as is shown in FIG. 12, before a further connection is prevented upon a further loading of the frame stand 101 due to the positive-locking parts 200 received in the positive receptacles 105.

Figure 8:
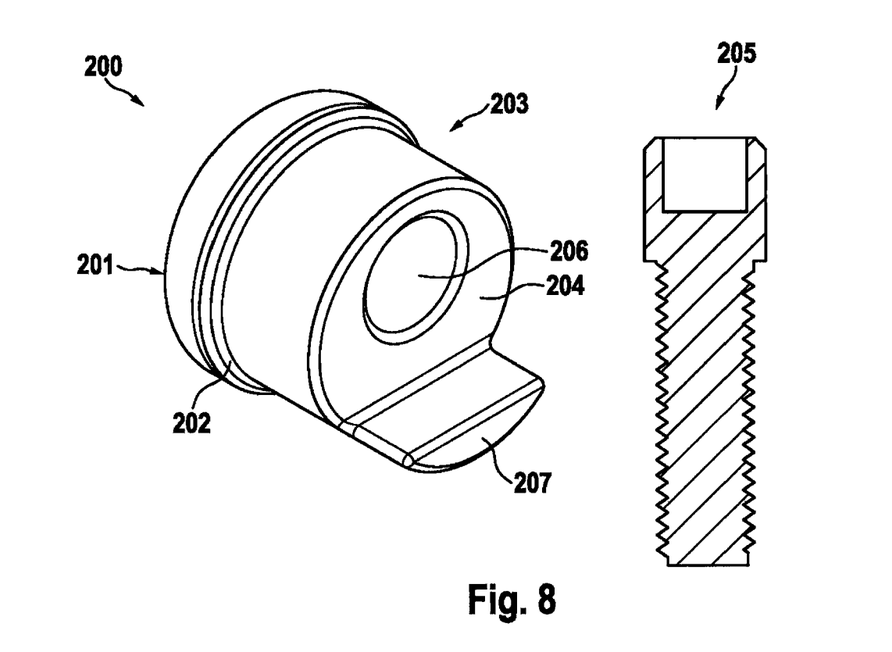
FIG. 8 shows a first embodiment of a positive-locking part.
Figure 9:
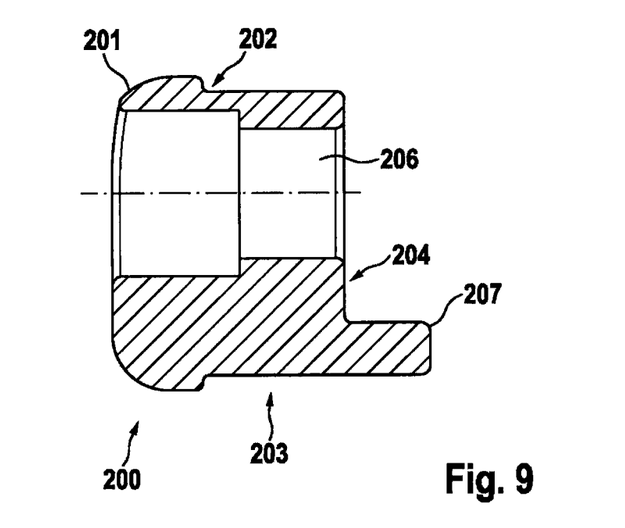
FIG. 9 shows a cross-sectional view of the body of the embodiment according to FIG. 8.

FIGS. 8 and 9 show a first embodiment of the positive-locking part 200. The positive-locking part 200 has a free end 201 which merges over an undercut 202 into a shaft 203. The free end 201, the undercut 202 and the shaft 203 form a body 204 which comprises a through bore 206 eccentric to the axis of symmetry of the positive-locking part 200. A projection 207 extends from a back side of the positive-locking part arranged opposite the front side of the free end 201, which side simultaneously forms a contact surface of the shaft 203 via which the positive-locking part 200 comes to rest on the frame stand of a switch cabinet, which projection, referring to the embodiment shown in FIGS. 2 and 3, comes to rest on a corresponding, horizontal support of the frame stand in order to align the positive-locking part 200 in advance in the vertical direction. A fastening means 205 in the form of a threaded bolt is provided for extending through the through bore 206 into a frame stand of a switch cabinet, where the threaded bolt 205 can be screwed, for example, into a cage nut and therefore fixes the body 204 on the frame stand.

Figure 10:
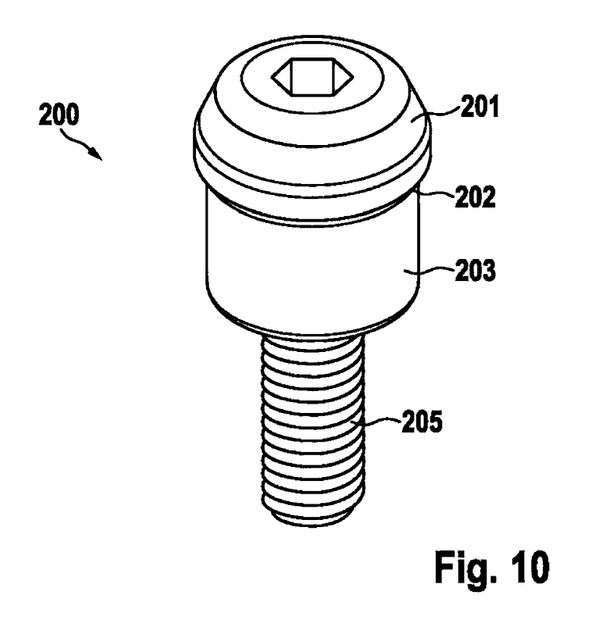
FIG. 10 shows a perspective view of another embodiment of a positive-locking part.
Figure 11:
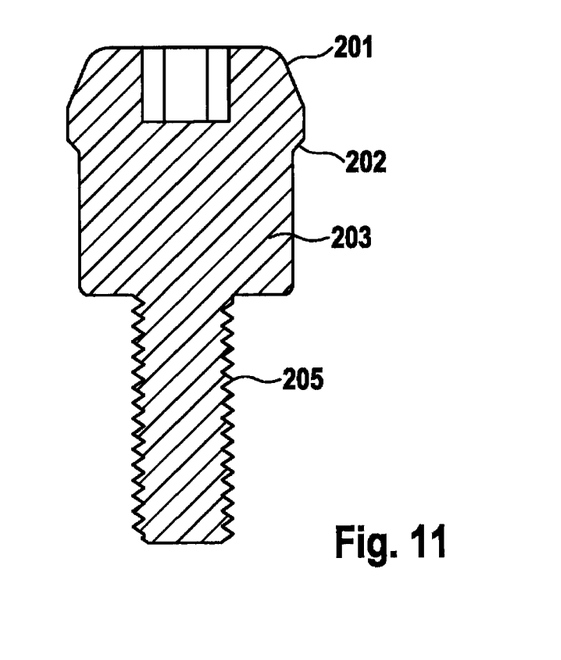
FIG. 11 shows a cross-sectional view of the body of the embodiment according to FIG. 10.

FIGS. 10 and 11 show another embodiment of a positive-locking part 200 which is constructed in particular in one part, deviating from the positive-locking part 200 shown in the FIGS. 8 and 9. As is also the case in the positive-locking part 200 shown in the FIGS. 8 and 9, the free end 201 is provided with a running contour which should facilitate the pivoting of the switch cabinet door into the closed position if, for example, the positive receptacle on the inner door side and the positive-locking part 200 are not exactly aligned with one another due to manufacturing tolerances. The free end 201 again merges via an undercut 202 into a shaft-shaped section 203. A threaded bolt 205 is formed on a contact side of the shaft 203 concentrically to the shaft-shaped section 203 via which the positive-locking part 200 can be brought in contact with a frame stand.

The features of the invention disclosed in the previous specification, in the drawings and in the claims can be essential for realizing the invention individually as well as in any combination.

What is claimed is:

1. A stabilizing arrangement for transporting a switch cabinet comprising:
   a frame stand having vertical and horizontal struts;

a switch cabinet door fastened on a door side of the frame stand by at least one hinge, so that the switch cabinet door can be pivoted back and forth between an open position in which the switch cabinet door is pivoted away from the door side and a closed position in which the switch cabinet door rests on the door side;

at least one positive-locking part is fastened on the door side of the frame stand, the at least one positive-locking part extends away from the door side with its free end and includes an undercut on its free end;

the switch cabinet door includes a positive receptacle into which the positive-locking part extends in the closed position, with the undercut of the positive-locking part passing through the positive receptacle;

the positive-locking part includes a body that includes the free end and a shaft bordering on it via the undercut on the outer circumference of the positive-locking part, via which shaft the positive-locking part borders on the door side, and includes a fastener that immovably fixes the body on the door side;

the body and the fastener are separate structural components and the body includes a through bore via which the body is fastened to the door side with the fastener; and the through bore extends through the body eccentrically and parallel to an axis of symmetry of the body, wherein the shaft includes a projection on its end facing the door side, which projection is also arranged eccentrically to the axis of symmetry of the body but opposite the through bore relative to the axis of symmetry, and wherein the shaft rests with the projection on a horizontal support of the frame stand.

2. The stabilizing arrangement according to claim 1, in which the free end has a maximum dimension in the direction vertical to the extension direction of the positive-locking part, said dimension corresponding to an inner dimension of the positive receptacle.

3. The stabilizing arrangement according to claim 1, in which the free end merges in the direction of the extension of the positive-locking part on the undercut into the shaft of the positive-locking part via which the positive-locking part is fixed on the door side.

4. The stabilizing arrangement according to claim 3, in which the shaft has a maximum dimension in the direction vertical to the direction of the extension of the positive-locking part which dimension is smaller than an inner dimension of the positive receptacle.

5. The stabilizing arrangement according to claim 1, in which the positive receptacle is a perforation in a U-shaped doubling back on the outer circumference of the switching cabinet door.

6. The stabilizing arrangement according to claim 1, in which the door side has a rectangular profile frame, wherein two of the positive-locking parts are arranged in a diametrically opposite manner on the profile frame.

7. The stabilizing arrangement according to claim 6, in which two pairs of positive-locking parts are arranged on the profile frame, of which the two positive-locking parts of a first one of the pairs and the two positive-locking parts of a second one of the pairs are arranged diametrically opposed, in particular in diametrically opposed corner areas of the profile frame.

8. The stabilizing arrangement according to claim 1, in which the frame stand has a rectangular bottom frame having four horizontal struts of which one horizontal strut lies in the door side and at least one holding angle is mounted on this horizontal strut via a fastening flange of the holding angle which is located in the door side, wherein the at least one positive-locking part is fixed on the fastening flange and the fastening flange is fixed on the horizontal strut via a threaded bolt of the positive-locking part.

9. The stabilizing arrangement according to claim 8, in which the switch cabinet is fastened by the at least one holding angle to at least one sliding board underneath the bottom frame, wherein the bottom frame stands up on a transport pallet under which a forklift can move via the at least one holding angle at a distance from the at least one sliding board.

10. The stabilizing arrangement according to claim 9, in which the bottom frame comprises a holding angle designed as an L-angle, on each of its four corners by which the switch cabinet is fastened to a sliding board, wherein the distance from the at least one sliding board at which the bottom frame is fastened to the at least one sliding board corresponds to a vertical dimension of the switch cabinet base, and wherein the holding angle is fastened to a vertical side of the bottom frame and extends away from the switch cabinet with its standing-up flange, so that a standing-up side of the bottom frame is completely free for the mounting of a switch cabinet base on the standing-up side.

11. The stabilizing arrangement according to claim 9, in which the transport pallet comprises a border which surrounds at least one sliding board so that the switch cabinet cannot be moved on the transport pallet in the horizontal direction.

12. A stabilizing arrangement for transporting a switch cabinet comprising:
a frame stand having vertical and horizontal struts;
a switch cabinet door fastened on a door side of the frame stand by at least one hinge, so that the switch cabinet door can be pivoted back and forth between an open position in which the switch cabinet door is pivoted away from the door side and a closed position in which the switch cabinet door rests on the door side;
at least one positive-locking part is fastened on the door side of the frame stand, the at least one positive-locking part extends away from the door side with its free end and includes an undercut on its free end;
the switch cabinet door includes a positive receptacle into which the positive-locking part extends in the closed position, with the undercut of the positive-locking part passing through the positive receptacle;
the frame stand has a rectangular bottom frame having four horizontal struts of which one horizontal strut lies in the door side and at least one holding angle is mounted on this horizontal strut via a fastening flange of the holding angle which is located in the door side, wherein the at least one positive-locking part is fixed on the fastening flange and the fastening flange is fixed on the horizontal strut via a threaded bolt of the positive-locking part; and
the switch cabinet is fastened by the at least one holding angle to at least one sliding board underneath the bottom frame, wherein the bottom frame stands up on a transport pallet under which a forklift can move via the at least one holding angle at a distance from the at least one sliding board.

* * * * *